United States Patent
Sriraman et al.

(10) Patent No.: US 7,303,999 B1
(45) Date of Patent: Dec. 4, 2007

(54) MULTI-STEP METHOD FOR ETCHING STRAIN GATE RECESSES

(75) Inventors: Saravanapriyan Sriraman, Fremont, CA (US); Linda Braly, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/395,921

(22) Filed: Mar. 31, 2006

Related U.S. Application Data

(60) Provisional application No. 60/750,776, filed on Dec. 13, 2005.

(51) Int. Cl.
*H01L 21/302* (2006.01)

(52) U.S. Cl. ............ 438/719; 438/714; 438/723

(58) Field of Classification Search ........... 438/706, 438/710, 712, 714, 719, 720, 723, 724, 733, 438/734, 739
See application file for complete search history.

(56) References Cited

U.S. PATENT DOCUMENTS

| | | | |
|---|---|---|---|
| 5,182,234 A * | 1/1993 | Meyer .................. | 438/695 |
| 6,096,612 A * | 8/2000 | Houston ................ | 438/296 |
| 6,180,466 B1 * | 1/2001 | Ibok .................... | 438/296 |
| 6,635,185 B2 * | 10/2003 | Demmin et al. ........ | 216/64 |
| 2003/0190766 A1 * | 10/2003 | Gonzalez et al. ...... | 438/57 |
| 2005/0026380 A1 * | 2/2005 | Kammnler et al. ..... | 438/305 |
| 2005/0148147 A1 * | 7/2005 | Keating et al. ........ | 438/299 |
| 2006/0131665 A1 * | 6/2006 | Murthy et al. ......... | 257/384 |

* cited by examiner

*Primary Examiner*—Kin-Chan Chen
(74) *Attorney, Agent, or Firm*—IP Strategy Group, P.C.

(57) ABSTRACT

Methods of performing controllable lateral etches into the silicon layer using a plasma-enhanced etch-deposit-etch sequence are disclosed. The first etch step etches into the silicon layer. The deposition step passivates horizontal surfaces, including the bottom of the etched feature. The second etch step increases the lateral undercut, resulting in a low V:L ratio silicon layer etch.

24 Claims, 6 Drawing Sheets

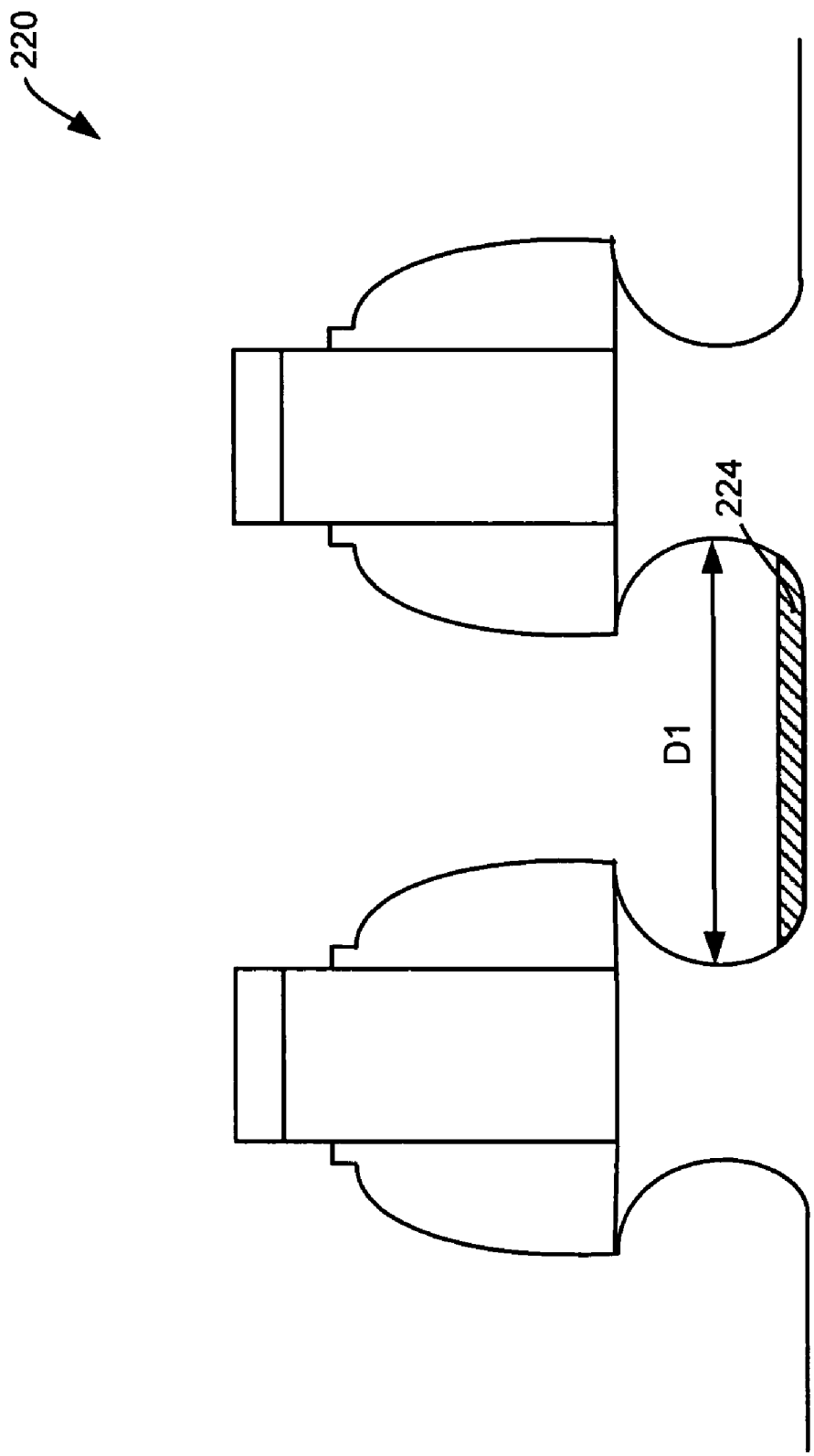

MULTI-STEP METHOD FOR ETCHING STRAIN GATE RECESSES

This application claims priority under 35 USC 119(e) to a previously filed commonly assigned provisional application entitled "Multi-Step Method for Etching Source-Drain Recess Applications with V/L Requirements" Application Ser. No. 60/750,776, filed on Dec. 13, 2005, which is incorporated by reference herein.

BACKGROUND OF THE INVENTION

New methods for achieving faster transistors are being developed for the 90 nm semiconductor logic technology and below. One method for achieving faster transistors is to "strain" the silicon under the gate electrode. There are several ways to achieve the strain. One way is to etch away the silicon in the vicinity of the gate and to fill the recess with silicon germanium (SiGe) or another suitable material. The SiGe then forms a compressive strain on the gate channel. This compressive strain has been known to enhance hole mobility and thus improve the performance of PMOS devices.

FIG. 1 shows an example prior art PMOS transistor architecture that features a recess for forming the compressive strain. PMOS transistor 100 includes a polysilicon (or another suitable gate material) gate 108 that is surrounded by a spacer (102 of FIG. 1). A hard mask 118 is shown disposed above the polysilicon line. The spacer material may be formed of, for example, silicon nitride, which may be deposited by a low pressure chemical vapor deposition (LPCVD) process. An oxide liner may also be employed (not shown).

An etch process removes the silicon material (e.g., bulk c-Si or Silicon-On-Insulator, also known as SOI) in silicon layer 110 to a depth 104. The etching proceeds both vertically into silicon layer 110 and laterally under spacer 102 to form a recess 114, where the SiGe strain will be formed. Etching laterally under spacer 102 permits the strain to be formed near the gate channel, thereby improving performance.

Plasma etching has been employed for the silicon etch to create the strain recess. Due to shadowing of the neutrals species by the spacer (102) itself, for example, etching of the recess under the spacer (102) can be challenging. In particular, it is important that the etching of the strain recess be well controlled so that while a substantial and controlled amount of lateral etching of the silicon material into the region under spacer 102 is achieved, the remainder of silicon layer 110 is not unduly damaged. A well-controlled low V:L ratio etch (i.e., an etch into the silicon layer with a low vertical to lateral etch ratio) is therefore desired to effectively strain the gate and enhance hole mobility to improve device performance.

SUMMARY OF THE INVENTION

A method for etching a silicon layer disposed on a substrate, the silicon layer having thereon a plurality of spacer features disposed so as to create openings to the silicon layer. The method includes etching in a first plasma etch step into the silicon layer through the openings, thereby forming etched features in the silicon layer. The method also includes forming, after terminating the first plasma etch step, deposition at the bottom of the etch features using a deposition recipe that is different from a recipe employed during the first plasma etch step. The method also includes etching, after terminating the deposition recipe, in a second plasma etch step the silicon layer through the etched features using a second etch recipe, wherein the second etch recipe is configured to etch sidewalls of the etched features at a faster rate than downward into the silicon layer.

In another embodiment, the invention relates to a method for creating a strain PMOS transistor on a semiconductor substrate. The method includes providing the semiconductor substrate having thereon a silicon layer, the silicon layer having thereon a plurality of spacer features disposed so as to create openings to the silicon layer through the plurality of spacer features. The method also includes etching in a first plasma etch step into the silicon layer through the openings, thereby forming recesses into the silicon layer and laterally extending under the plurality of spacer features. The method also includes performing, after terminating the first plasma etch step, a deposition step to form deposition at the bottom of the etch features using a deposition recipe that is different from a recipe employed during the first plasma etch step. The method additionally includes etching, after terminating the deposition step, in a second plasma etch step the silicon layer through the etched features using a second etch recipe that results in a more isotropic etch than the first plasma etch step. The method includes performing a $O_2$ plasma flash step after the second plasma etch step to remove at least a portion of the deposition.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2A-2C show, in accordance with an embodiment of the present invention, an etch-deposit-etch sequence to accomplish a controllable lateral etch into the silicon layer.

DETAILED DESCRIPTION OF EMBODIMENTS

Figure 1:
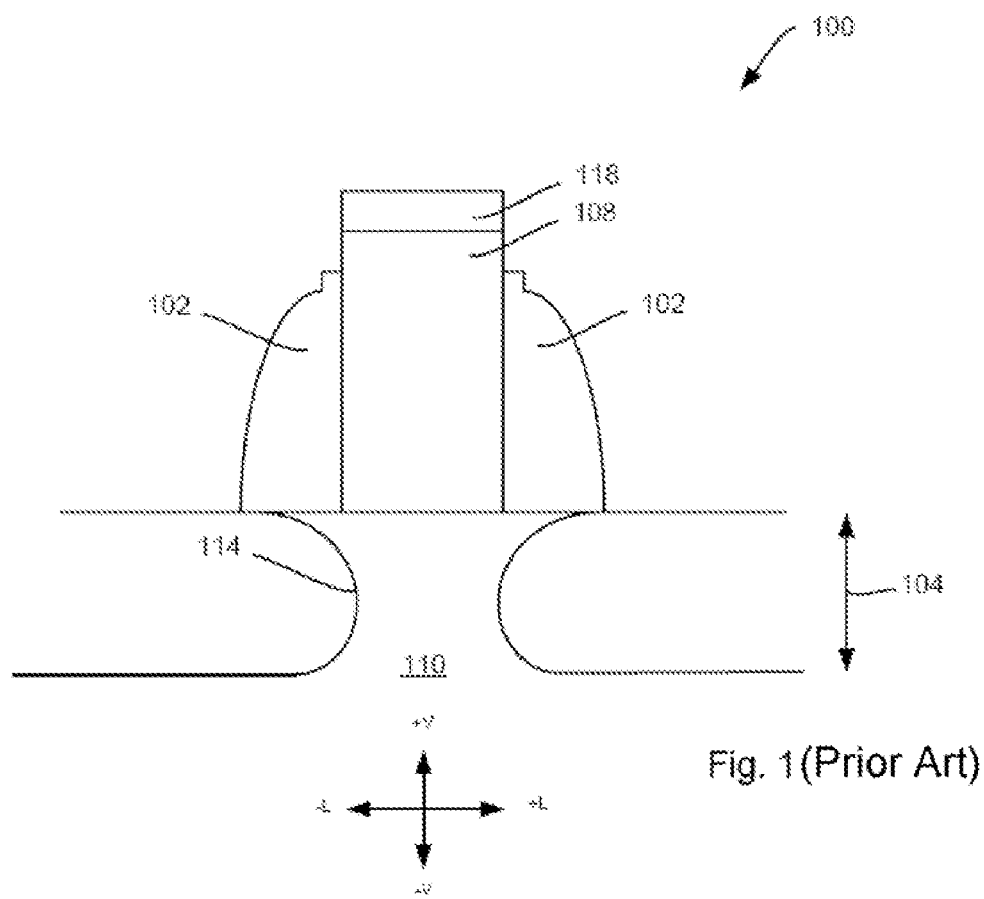
FIG. 1 shows an example prior art PMOS transistor architecture that features a recess for forming the compressive strain.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Embodiments of the invention relate to plasma etch methods for creating recesses in the silicon layer to facilitate the creation of the above-discussed compressive strain. Embodiments of the present invention disclose methods of etching wafers to achieve low vertical-to-lateral (V:L) etch profiles into the silicon layer. A low V:L etch refers to an etch that has a higher lateral etch component relative to the vertical etch component.

In an embodiment, the method uses an etch-deposition-etch sequence. The first etch involves etching into a silicon layer 202 (see FIG. 2A—not to scale to improve clarity) through openings among the spacer features. In an embodiment, the first etch is configured to be substantially vertical in nature at least for a portion of the first etch, or with a small degree of lateral etching. In another embodiment, the first etch step is substantially isotropic in nature. The first etch may be a single etch step or may comprise multiple etch substeps. For example, the first etch step may include a break-through etch substep that is configured to break through the native oxide layer atop silicon layer 202 of FIG. 2A. A suitable process gas such as CF4 or other suitable oxide breakthrough gases or gas mixtures may be employed. For example, a breakthrough etch substep in a LAM 2300 VERSYS KIYO™ plasma processing system, available from Lam Research Corporation (Fremont, Calif.), may employ a recipe that specifies 2 mT chamber pressure, 350W TCP power, 350V bias, 25 sccm of CF4 centrally injected to etch a substrate disposed on an ESC (electrostatic) chuck having a temperature of 60 degrees Celsius. The break-through etch substep employing the plasma formed in accordance with the aforementioned recipe may last, for example, about 5 seconds or longer.

The first etch step may include, additionally or alternatively, a main etch substep that is configured to etch substantially anisotropically (i.e., vertically) into the substrate to, for example, reduce microloading, improve surface smoothness and/or improve the overall processing time. A suitable process gas mixture such as HBr/O$_2$ or other suitable gases or gas mixtures may be employed. For example, a main etch substep in the aforementioned KIYO™ system may employ a recipe that specifies 5 mT chamber pressure, 350W TCP power, 65V bias, 200 sccm of HBr and 5 sccm of O2 centrally injected to etch a substrate disposed on an ESC chuck having a temperature of 60 degrees Celsius. The main etch substep employing the plasma formed in accordance with the aforementioned recipe may last, for example, about 5 seconds to about 15 seconds.

Figure 2A:
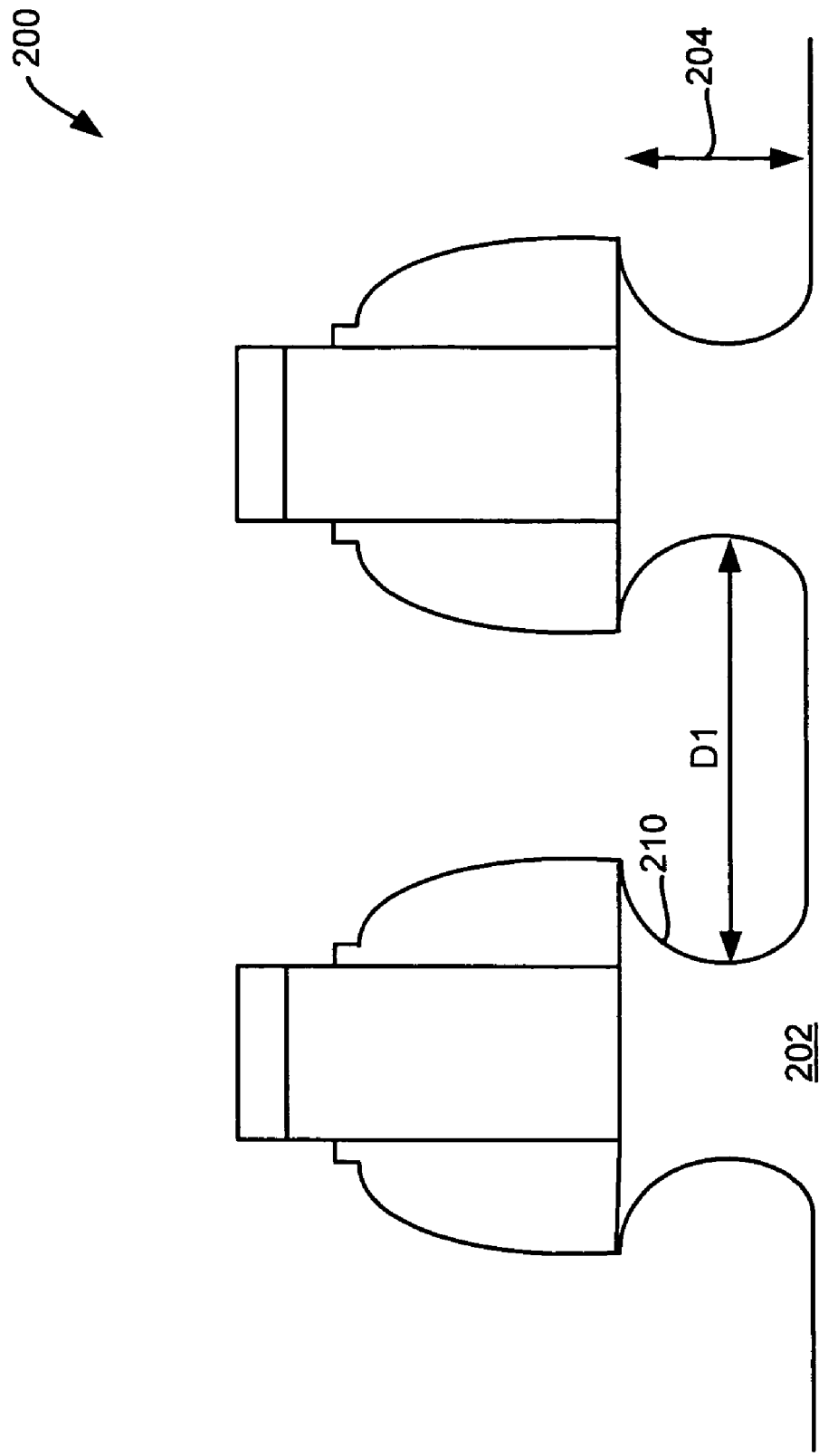

The first etch step may include, additionally or alternatively, a pre-deposition isotropic etch substep that is configured to etch substantially isotropically (i.e., both vertically and laterally). This pre-deposition isotropic etch substep not only etches vertically into a silicon layer 202 but also etches laterally to form the undercut under the spacer in etched feature 210. As seen in FIG. 2A, etch feature 210 has a lateral dimension of D1.

A suitable process gas such as SF6/Ar or other suitable gases or gas mixtures may be employed. For example, a pre-deposition isotropic etch substep in the aforementioned KIYO™ system may employ a recipe that specifies 2 mT chamber pressure, 200W TCP power, 0V bias, 10 sccm of SF6, and 80 sccm of Ar centrally injected to etch a substrate disposed on an ESC chuck having a temperature of 60 degrees Celsius. The pre-deposition isotropic etch substep employing the plasma formed in accordance with the aforementioned recipe may last, for example, 40 seconds to reach a depth 204 as shown in FIG. 2A.

In an example the pre-deposition isotropic etch substep employs substantially no bias power or a lower bias power level than the bias power level employed during the main etch substep. Process gases which can etch silicon substantially isotropically may be used. These gases include, for example, but are not restricted to, SF$_6$, NF$_3$, HBr, Cl$_2$, HI, HCl, and/or mixtures of these gases.

To improve device performance, it is desirable to increase lateral width D1 of etched feature 210. For performance reasons, an etch process that can increase width D1 without substantially increasing the depth 204 of etched feature 210 is desired. Embodiments of the invention include additional processing steps discussed below to achieve this goal.

In an embodiment, a layer of polymer 224 (see FIG. 2B—not to scale to improve clarity) or another suitable passivating material is then deposited on the wafer, including on the bottom surfaces of the etch feature created using the first etch. The deposited material substantially inhibits or reduces the vertical etch component in a subsequent etch step. Preferably, the deposition (or passivating) process is chosen such that more polymer or passivating material is deposited on horizontal surfaces (such as the bottom of etched feature 210) than on vertical surfaces (such as the recess sidewalls of recess 210). The inventors have found that a low chamber pressure (e.g., under 10 mT) tends to promote more deposition on horizontal surfaces relative to the deposition on the vertical surfaces. Accordingly, in an embodiment, a relatively low chamber pressure between about 1 mT and about 10 mT, or preferably between about 2 mT and about 6 mT, is employed. Any other recipes employing the same gas or different gas(es) that can deposit/passivate more on horizontal surfaces relative to vertical surfaces of the features may also be employed, in various embodiments.

Note that the pre-deposition isotropic etch discussed earlier increases the undercutting under the spacer, thereby effectively hiding or shielding the vertical sidewalls of etched feature 210 under the spacer material during the deposition substep. This may cause, in some cases, less deposition/passivation material to be deposited on the vertical sidewalls of the etched feature relative to the amount of deposition/passivation material deposited at the bottom of the etched feature. In this manner, the sidewalls of the etched feature are protected to a lesser extent, allowing a subsequent silicon etch process to etch more laterally than vertically.

A suitable process such as CH$_3$F or other suitable gases or gas mixtures may be employed. For example, a deposition step in the aforementioned KIYO™ machine may employ a recipe that specifies 2 mT chamber pressure, 250 W TCP power, 0V bias, and 100 sccm of CH$_3$F centrally injected to passivate a substrate disposed on an ESC chuck having a temperature of 60 degrees Celsius. Thus, in an embodiment, the deposition is advantageously performed in-situ relative to the first etch step and the second etch step of the sequence (discussed below). This is highly advantageous from a process time and/or wafer throughput standpoint.

The passivating/deposition employing the plasma formed in accordance with the aforementioned recipe may last, for example, about 10 seconds to about 15 seconds. In various embodiments, the passivating/deposition step may employ other gases which can deposit a polymer or other passivating material on the surface of the wafer including, for example, but are not restricted to, CHF$_3$, CH$_2$F$_2$, CH$_3$F, SiCl$_4$, O$_2$, CH$_4$, C$_2$H$_4$, and/or mixtures thereof.

Figure 2C:
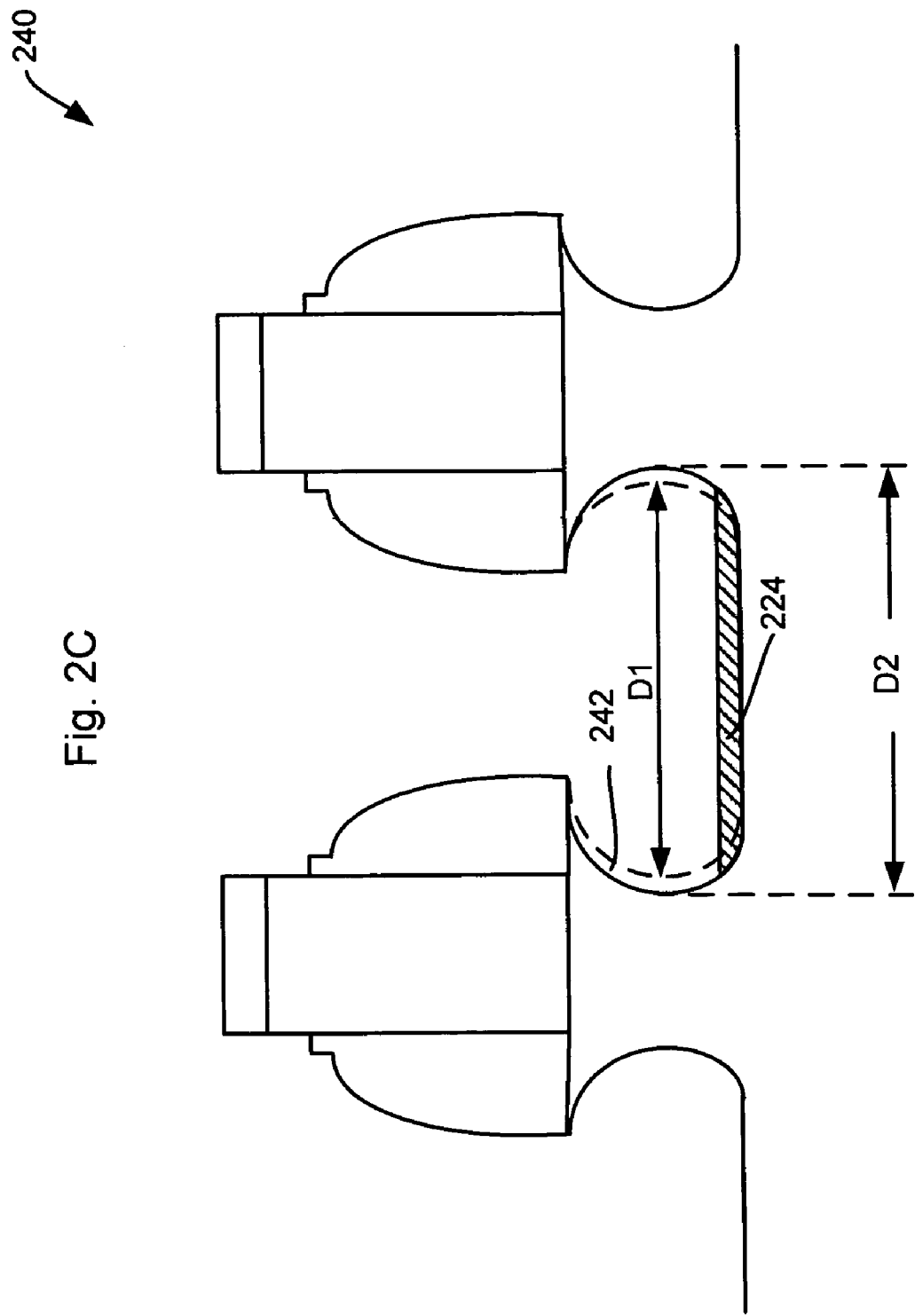

Once the deposition is formed, this deposition protects the horizontal surfaces, including the bottom of the etched features. The second etch step (FIG. 2C—not to scale to improve clarity) etches silicon substantially isotropically through the etched features created during the first etch step. However, the second etch step does not etch the polymer deposition to a substantial degree, thereby causing the sidewalls of the etched features to be removed at a higher rate than the etch rate downward into the silicon layer. Alternatively, the second etch step imparts a high degree of lateral etching and a low (or none) degree of vertical etching into the silicon layer. Accordingly, a recipe (including gas mixture) may be chosen for this second silicon etch to give a relatively high degree of selectivity to the deposited material of the deposition step (e.g., polymer). This isotropic etching results in a controllable undercut amount 242 in FIG. 2C (controllable vertical:lateral ratio).

A suitable process gas such as $SF_6$/Ar or other suitable gases or gas mixtures may be employed. For example, the second etch step performed in the aforementioned KIYO™ system may employ a recipe that specifies 2 mT chamber pressure, 200W TCP power, 0V bias, 10 sccm of SF6, and 80 sccm of Ar centrally injected to etch a substrate disposed on an ESC chuck having a temperature of 60 degrees Celsius. The second etch substep employing the plasma formed in accordance with the aforementioned recipe may last, for example, about 10 seconds to about 30 seconds to expand from the lateral dimension D1 (of FIG. 2A) to dimension D2 of FIG. 2C.

In an embodiment, the second etch step employs substantially no bias power or little bias power. Recipes and gases which can etch silicon substantially isotropically may be used. These gases include, without limitation, such gases as SF6, NF3, HBr, Cl2, HI, HCl, and/or the like.

After the recess is formed using the etch-deposition-etch sequence described, the deposited material 224 can be removed using, for example, a $O_2$ plasma flash process or a wet clean removal process. For example, the substrate can be processed in-situ with 1000W TCP power, 0W bias, 200 sccm, of $O_2$ for about 40-60 seconds to remove the deposited material. Wet cleaning may employ a diluted mixture of sulphuric acid and hydrogen peroxide, for example, to remove the deposition.

Figure 3:
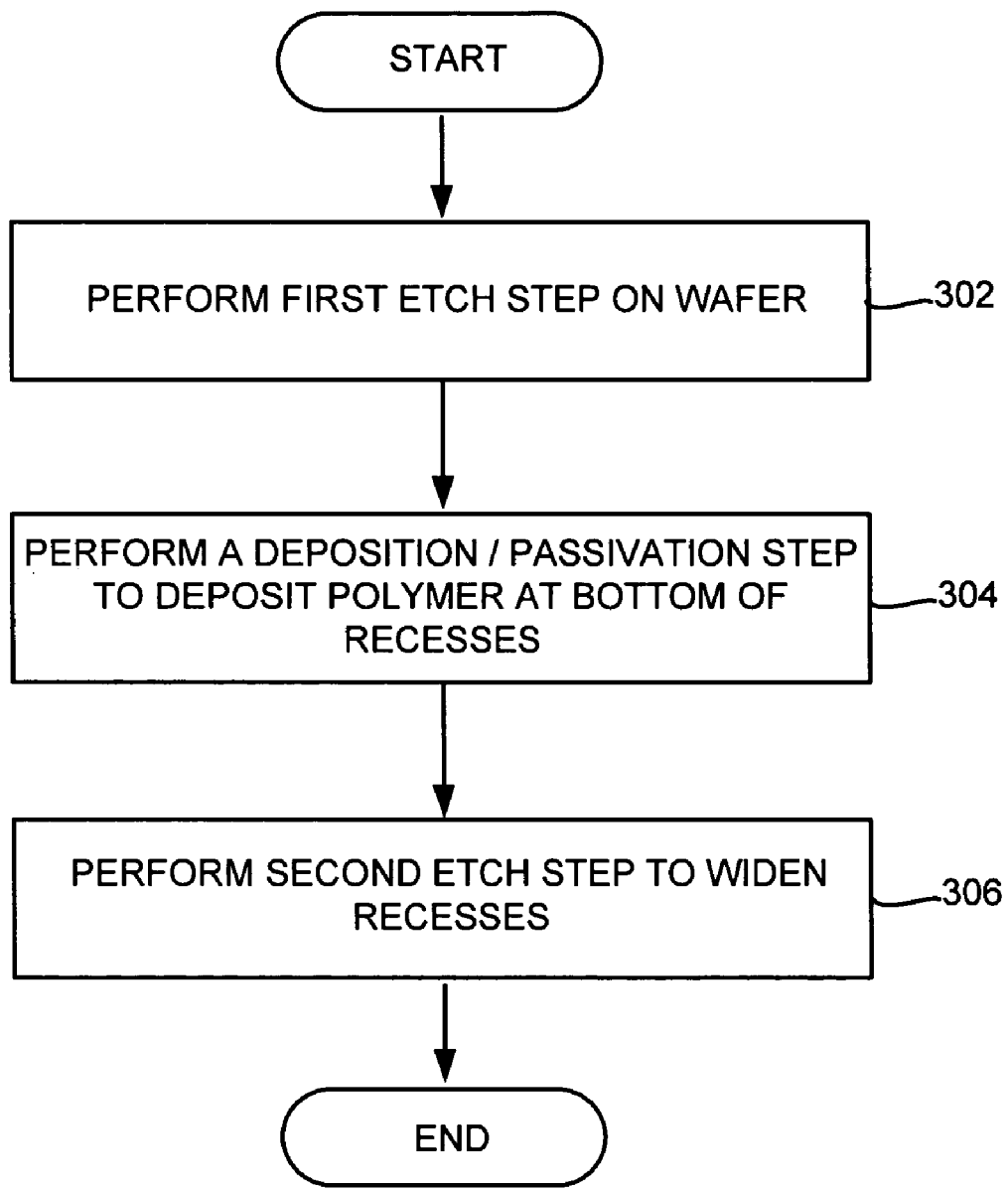
FIG. 3 shows, in accordance with an embodiment of the invention, the steps involved in the multi-step strain gate etch process.

FIG. 3 shows, in accordance with an embodiment of the invention, the steps involved in the multi-step strain gate etch process. In step 302, a first etch step is performed on the substrate to etch into silicon layer. In step 304, a deposition step is performed to create deposition/passivation at the bottom of the etched features that are formed during the first etch step 302. In step 306, a second etch step is performed to increase the undercut by laterally etching under the spacer. During the second etch step, the vertical component of the etch is substantially reduced (or eliminated) by the presence of the deposition/passivation material that is deposited at the bottom of the recesses during step 304.

Figure 4:
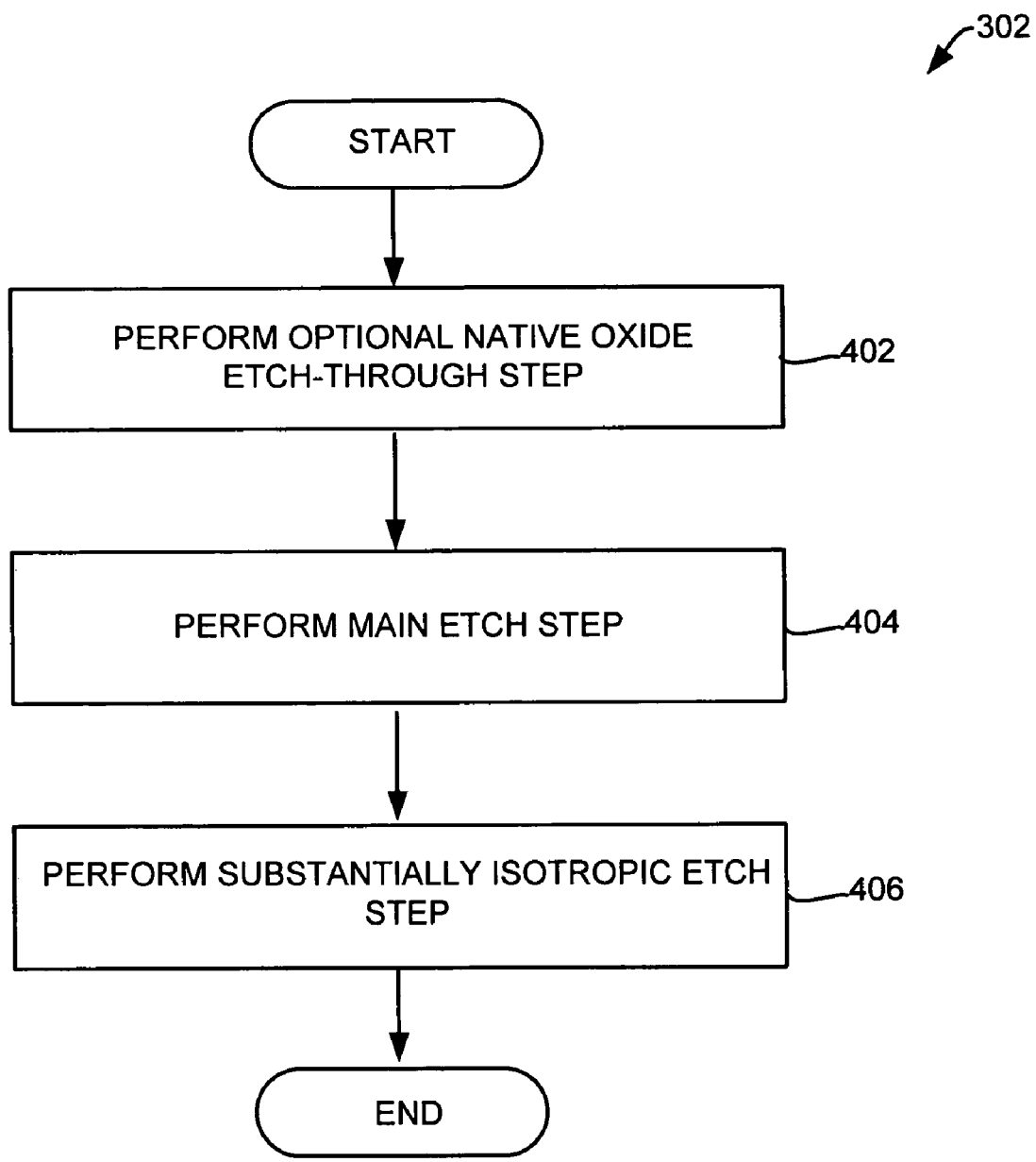
FIG. 4 shows in greater detail, in accordance with another embodiment of the present invention, the first etch step.

FIG. 4 shows in greater detail, in accordance with another embodiment of the present invention, the first etch step, such as step 302 of FIG. 3. The first etch step may begin with an optional break-through etch substep (402) to clear the native oxide layer. The first etch step may include an optional main etch substep 404 to quickly etch downward into the silicon layer. The first step may also include a substantially isotropic etch substep 406 to increase the lateral etching component prior to deposition/passivation. Note that other substeps may be possible, and not all substeps of FIG. 4 are always required.

For comparison purposes, example recess etches using a prior art etch process yield vertical-to-lateral (V:L) etch profiles that range from about 3 to about 3.5. The same wafers are etched using the disclosed multi-step strain gate etch process, yielding vertical-to-lateral (V:L) etch profiles that range from about 1 to about 1.9.

The inventive etch process also works well for tight line spacing corresponding to, for example, 32 nm technology and down to as small as 25 nm or even lower.

As can be appreciated from the foregoing, embodiments of the invention provide controllable lateral etches into the silicon layer and under the spacer. This permits the creation of aster yet reliable PMOS transistors by rendering it possible to create a reliable compressive strain on the gate channel and thereby enhancing the hole mobility. In this manner, the performance of transistor devices such as PMOS devices may be enhanced.

While this invention has been described in terms of several embodiments, there are alterations, permutations, and equivalents, which fall within the scope of this invention. For example, while the parameters and parameter ranges are furnished in the examples herein, these values should not be construed as limiting. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching a silicon layer disposed on a substrate, said silicon layer having thereon a plurality of spacer features disposed so as to create openings to said silicon layer, comprising:

etching in a first plasma etch step into said silicon layer through said openings, thereby forming etched features in said silicon layer;

after terminating said first plasma etch step, forming deposition at the bottom of said etched features using a deposition recipe that is different from a recipe employed during said first plasma etch step; and after terminating said deposition recipe, etching in a second plasma etch step said silicon layer through said etched features using a second etch recipe, wherein said second etch recipe is configured to etch sidewalls of said etched features at a faster rate than downward into said silicon layer.

2. The method of claim 1 wherein said first plasma etch step and said forming deposition are performed in-situ in the same plasma processing system.

3. The method of claim 1 wherein said second plasma etch step is performed in a plasma processing chamber using a bottom power level that is substantially zero.

4. The method of claim 1 wherein said second plasma etch step employs a gas mixture that includes SF6.

5. The method of claim 4 wherein said gas mixture also includes Ar.

6. The method of claim 1 wherein said first plasma etch step includes at least a main etch substep and a first etch substep that is performed later in time than said main etch substep, said main etch subset representing an etch that is more anisotropic than said first etch substep.

7. The method of claim 6 wherein said first etch substep is performed in a plasma processing chamber using a bottom power level that is substantially zero.

8. The method of claim 6 wherein said first plasma etch step includes a break through etch substep that occurs before said main etch substep.

9. The method of claim 1 wherein said deposition step is performed in a plasma processing chamber, the chamber pressure inside said plasma processing chamber during which deposition step is less than about 10 milliTorr.

10. The method of claim 1 wherein said deposition step is performed in a plasma processing chamber, the chamber pressure inside said plasma processing chamber during which deposition step is between about 2 milliTorr and about 6 milliTorr.

11. The method of claim 1 wherein said first etch step is configured to create lateral undercutting into said silicon layer under said plurality of said spacer features.

12. The method of claim 1 wherein said first plasma etch step is configured to create undercutting in said silicon layer under said plurality of spacer features prior to said forming said deposition.

13. A method for creating a strain PMOS transistor on a semiconductor substrate, comprising:
   providing said semiconductor substrate having thereon a silicon layer, said silicon layer having thereon a plurality of spacer features disposed so as to create openings to said silicon layer through said plurality of spacer features;
   etching in a first plasma etch step into said silicon layer through said openings, thereby forming etched features, including recesses extending into said silicon layer and laterally extending under said plurality of spacer features;
   after terminating said first plasma etch step, performing a deposition step to form deposition at the bottom of said etched features using a deposition recipe that is different from a recipe employed during said first plasma etch step;
   after terminating said deposition step, etching in a second plasma etch step said silicon layer through said etched features using a second etch recipe that results in a more isotropic etch than said first plasma etch step; and
   performing a O2 plasma flash step after said second plasma etch step to remove at least a portion of said deposition.

14. The method of claim 13 wherein said first plasma etch step and said forming deposition are performed in-situ in the same plasma processing system.

15. The method of claim 13 wherein said second plasma etch step is performed in a plasma processing chamber using a bottom power level that is substantially zero.

16. The method of claim 13 wherein said second plasma etch step employs a gas mixture that includes $SF_6$.

17. The method of claim 16 wherein said gas mixture also includes Ar.

18. The method of claim 13 wherein said first plasma etch step includes at least a main etch substep and a first etch substep that is performed later in time than said main etch substep, said main etch subset representing an etch that is more anisotropic than said first etch substep.

19. The method of claim 18 wherein said first etch substep is performed in a plasma processing chamber using a bottom power level that is substantially zero.

20. The method of claim 18 wherein said first plasma etch step includes a breakthrough etch substep that occurs before said main etch substep.

21. The method of claim 13 wherein said deposition step is performed in a plasma processing chamber, the chamber pressure inside said plasma processing chamber during which deposition step is less than about 10 milliTorr.

22. The method of claim 13 wherein said deposition step is performed in a plasma processing chamber, the chamber pressure inside said plasma processing chamber during which deposition step is between about 2 milliTorr and about 6 milliTorr.

23. The method of claim 13 wherein said first etch step is configured to create lateral undercutting into said silicon layer under said plurality of said spacer features.

24. The method of claim 13 wherein said first plasma etch step is configured to create undercutting in said silicon layer under said plurality of spacer features prior to said forming said deposition.

* * * * *